United States Patent
Ono et al.

(10) Patent No.: US 10,297,481 B2
(45) Date of Patent: May 21, 2019

(54) MAGNETIC ANNEALING APPARATUS

(71) Applicant: Tokyo Electron Limited, Tokyo (JP)

(72) Inventors: Yuji Ono, Iwate (JP); Toru Ishii, Tokyo (JP); Makoto Saito, Iwate (JP); Mitsuru Obara, Iwate (JP); Yasushi Takeuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 735 days.

(21) Appl. No.: 14/211,360

(22) Filed: Mar. 14, 2014

(65) Prior Publication Data
US 2014/0284321 A1    Sep. 25, 2014

(30) Foreign Application Priority Data

Mar. 21, 2013 (JP) .................. 2013-058324
Mar. 21, 2013 (JP) .................. 2013-058327

(51) Int. Cl.
*H05B 6/10* (2006.01)
*H01L 21/677* (2006.01)
*G11C 11/16* (2006.01)

(52) U.S. Cl.
CPC .. *H01L 21/67781* (2013.01); *H01L 21/67754* (2013.01); *G11C 11/16* (2013.01)

(58) Field of Classification Search
CPC ............................................ H05B 6/10–6/104
USPC ....... 219/601, 635–637, 643, 645, 650, 653, 219/660
See application file for complete search history.

(56) References Cited

U.S. PATENT DOCUMENTS

| | | | | |
|---|---|---|---|---|
| 4,859,823 A | * | 8/1989 | Faber | H05B 6/103 219/637 |
| 5,525,780 A | * | 6/1996 | Moslehi | H01L 21/67103 118/725 |
| 5,972,116 A | * | 10/1999 | Takagi | C23C 16/4401 118/719 |
| 6,099,457 A | * | 8/2000 | Good | A61K 51/1241 600/8 |
| 6,303,908 B1 | | 10/2001 | Yamaga et al. | |
| 6,433,661 B1 | | 8/2002 | Mita et al. | |
| 6,634,845 B1 | * | 10/2003 | Komino | B65G 49/06 414/217 |
| 6,741,804 B2 | | 5/2004 | MacK et al. | |
| 6,833,107 B2 | | 12/2004 | Kuriyama et al. | |

(Continued)

FOREIGN PATENT DOCUMENTS

JP    2001-068527 A    3/2001
JP    2002-175998 A    6/2002

(Continued)

*Primary Examiner* — Michael A Laflame, Jr.
(74) *Attorney, Agent, or Firm* — Abelmam, Frayne & Schwab

(57) ABSTRACT

A magnetic annealing apparatus is provided which performs a magnetic annealing on workpieces held in a workpiece boat by using a horizontal superconducting magnet as a magnetic field generating unit. The magnetic annealing apparatus includes a carrier configured to accommodate the workpieces before the magnetic annealing process; and a workpiece conveyance mechanism configured to convey the workpieces held in the carrier to the workpiece boat. The workpiece conveyance mechanism is capable of holding the workpieces in either a horizontal state or in a vertical state.

17 Claims, 8 Drawing Sheets

(56) References Cited

U.S. PATENT DOCUMENTS

| | | | |
|---|---|---|---|
| 6,899,145 B2* | 5/2005 | Aggarwal | H01L 21/67393 141/11 |
| 7,161,124 B2 | 1/2007 | Kisner et al. | |
| 7,179,416 B2 | 2/2007 | Ueno | |
| 7,264,768 B2 | 9/2007 | Tuttle et al. | |
| 2004/0079633 A1* | 4/2004 | Cheung | H01L 21/6708 204/242 |
| 2006/0082035 A1 | 4/2006 | Sugiyama et al. | |
| 2006/0096976 A1* | 5/2006 | Iwaki | G03F 7/38 219/635 |
| 2007/0051718 A1* | 3/2007 | Schmitt | B23P 19/006 219/635 |
| 2009/0097950 A1* | 4/2009 | Tanaka | H01L 21/67276 414/222.13 |
| 2010/0304574 A1* | 12/2010 | Nodera | C23C 16/345 438/791 |
| 2012/0288638 A1* | 11/2012 | Baxter | H05B 6/107 427/543 |
| 2012/0315113 A1* | 12/2012 | Hiroki | B65G 49/061 414/217 |
| 2015/0099235 A1* | 4/2015 | Watanabe | H01L 21/67109 432/45 |

FOREIGN PATENT DOCUMENTS

| | | |
|---|---|---|
| JP | 2004-263206 A | 9/2004 |
| JP | 2008-235934 A | 10/2008 |
| JP | 2009-152549 A | 7/2009 |
| JP | 2012-146984 A | 8/2012 |
| KR | 10-2000-0001935 A | 1/2000 |
| WO | 2010-074130 A | 7/2010 |
| WO | 2012-000663 A | 1/2012 |

* cited by examiner

MAGNETIC ANNEALING APPARATUS

CROSS-REFERENCE TO RELATED APPLICATIONS

This application is based on and claims priority from Japanese Patent Application Nos. 2013-058324 and 2013-058327, filed on Mar. 21, 2013 and Mar. 21, 2013, respectively, with the Japan Patent Office, the disclosures of which are incorporated herein in their entireties by reference.

TECHNICAL FIELD

The present disclosure relates to a magnetic annealing apparatus.

BACKGROUND

A magnetic random access Memory (MRAM), which is one of non-volatile memories, recently attracts attention as a next generation semiconductor memory device. The MRAM is manufactured by performing a heat treatment (magnetic annealing) on a magnetic film formed on a workpiece to be processed ("workpiece") which is, for example, a semiconductor wafer ("wafer") in a strong magnetic field to exhibit a magnetic property of the magnetic film.

For example, Japanese Patent Laid-open Publication No. 2004-263206 discloses a magnetic annealing apparatus which uses a solenoid type super-conducting magnet as a means for generating a magnetic field for performing a magnetic annealing processing and requires a relatively small installation area.

SUMMARY

The present disclosure provides a magnetic annealing apparatus. The magnetic annealing apparatus includes: a horizontal superconducting magnet that constitutes a magnetic field generating unit configured to conduct a magnetic annealing processing on one or more workpieces to be processed ("workpieces") held in a workpiece boat; a carrier configured to accommodate the workpieces before the magnetic annealing processing; and a workpiece conveyance mechanism configured to convey the workpieces held in the carrier to the workpiece boat, in which the workpiece conveyance mechanism is configured to hold the workpieces either in a horizontal state or in a vertical state.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
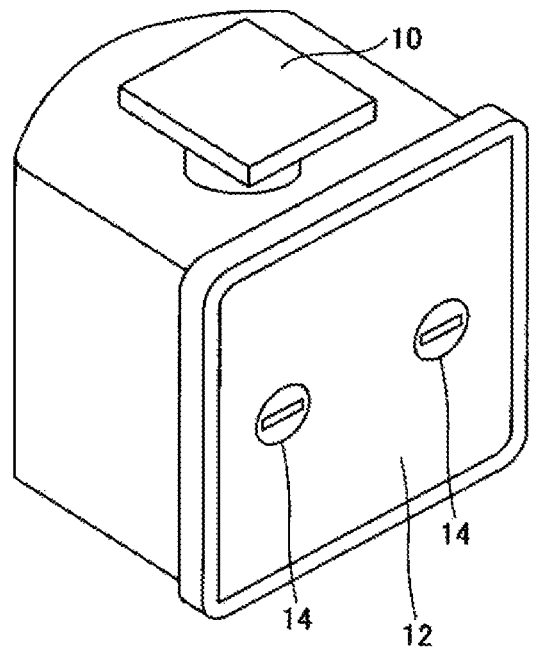
FIG. 1 is a schematic perspective view illustrating an example of a wafer carrier.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

As the magnetic annealing processings of wafers, there are known two methods, that is, a perpendicular magnetization method in which magnetic fields are applied in a direction perpendicular to main surfaces of the wafers, and an in-plane magnetization method in which magnetic fields are applied in a direction parallel to the main surfaces of the wafers.

At present, the two methods for magnetic annealing are carried out by separate apparatuses, respectively. Although it is not clear which one of the two methods for magnetic annealing will be put in the mainstream in the future, what is requested is a magnetic annealing apparatus capable of performing both the two magnetic annealing methods.

In relation to the above described problems, an object of the present disclosure is to provide a magnetic annealing apparatus which is capable of performing both the magnetic annealing processing of the perpendicular magnetization method and the in-plane magnetization method.

A first aspect of the present disclosure provides a magnetic annealing apparatus. The magnetic annealing apparatus includes: a horizontal superconducting magnet that constitutes a magnetic field generating unit configured to conduct a magnetic annealing processing on one or more workpieces to be processed ("workpieces") held in a workpiece boat; a carrier configured to accommodate the workpieces before the magnetic annealing processing; and a workpiece conveyance mechanism configured to convey the workpieces held in the carrier to the workpiece boat, in which the workpiece conveyance mechanism is configured to hold the workpieces either in a horizontal state or in a vertical state.

In the magnetic annealing apparatus of the first aspect, the workpiece conveyance mechanism has an arm portion which holds the workpieces and horizontally extends, and the arm portion is rotatable around an extension direction of the arm portion as an axis.

In the magnetic annealing apparatus of the first aspect, the workpiece conveyance mechanism holds the workpieces by a chuck mechanism.

The magnetic annealing apparatus of the first aspect further includes an aligner device configured to perform alignment of the workpieces, in which the workpiece conveyance mechanism conveys the workpieces held in the carrier to the aligner device, and conveys the aligned workpieces to the workpiece boat.

In the magnetic annealing apparatus of the first aspect, the workpieces are wafers and the carrier is a front opening unified pod (FOUP), in which the FOUP is configured to accommodate 25 sheets of wafers and the workpiece boat is configured to hold 100 sheets of wafers.

In the magnetic annealing apparatus of the first aspect, the workpiece boat is configured to accommodate the 100 sheets of wafers in a state where main surfaces of the wafers are vertical.

In the magnetic annealing apparatus of the first aspect, the workpiece boat is configured to hold two loading bodies, each of the two loading bodies being loaded with 50 sheets of wafers in a state where main surfaces of the wafers are horizontal.

In the magnetic annealing apparatus of the first aspect, the workpiece boat is configured to hold a first loading body in which 50 sheets of wafers are loaded in a state where main surfaces of the wafers are horizontal, and a second loading body in which 50 sheets of wafers are loaded in a state where main surfaces of the wafers are vertical.

A second aspect of the present disclosure provides a carrier conveyance region where a carrier that accommodates one or more workpieces to be processed ("workpieces") is conveyed; a workpiece conveyance region where the workpieces are conveyed; and an opening/closing door interposed between the carrier conveyance region and the workpiece conveyance region. The carrier conveyance region includes: a first mounting table where a carrier carried into the magnetic annealing apparatus is placed; a plurality of second mounting tables where the carrier is mounted so as to convey the workpieces from the carrier conveyance region to the workpiece conveyance region through the opening/closing door in a hermetically sealed manner; a storage unit configured to store a plurality of carriers; and a carrier conveyance mechanism configured to perform carrying-out/carrying-in of the carriers among the first mounting table, the second mounting tables, and the storage unit. The workpiece conveyance region includes: an aligner device configured to align the workpieces; a workpiece boat configured to hold the workpieces; a workpiece conveyance mechanism configured to convey the workpieces among the carrier disposed on the second mounting tables, the aligner device, and the workpiece boat; a heating unit configured to heat the workpieces; a magnetic field generating unit including a horizontal superconducting magnet and configured to apply a magnetic field to the workpieces held in the workpiece boat; and a transfer mechanism configured to transfer the workpieces held by the workpiece boat into the magnetic field generating unit, in which the workpiece conveyance mechanism is configured to hold the workpieces either in a horizontal state or in a vertical state.

A third aspect of the present disclosure provides magnetic annealing apparatus including: a horizontal superconducting magnet that constitutes a magnetic field generating unit configured to conduct a magnetic annealing processing on one or more workpieces to be processed ("workpieces"); a workpiece boat configured to hold the workpieces; a workpiece conveyance mechanism configured to convey the workpieces between a carrier that accommodates the workpieces and the workpiece boat; a transfer mechanism configured to transfer the workpieces held by the workpiece boat into the magnetic field generating unit; a clean gas introducing unit configured to introduce a clean gas; and an exhaust unit configured to exhaust the clean gas, in which a flow direction of the clean gas formed by the clean gas introducing unit and the exhaust unit is parallel to main surfaces of the workpieces held in the workpiece boat.

In the magnetic annealing apparatus of the third aspect, the clean gas introducing unit is disposed at a downstream side with respect to the workpiece boat in a conveyance direction where the workpiece conveyance mechanism conveys the workpieces to the workpiece boat, and the exhaust unit is disposed at an upstream side with respect to the workpiece conveyance mechanism in the conveyance direction where the workpiece conveyance mechanism conveys the workpieces to the workpiece boat.

In the magnetic annealing apparatus of the third aspect, the workpiece boat is configured to hold the main surfaces of the workpieces either horizontally or vertically, and the flow of the clean gas is a side flow.

In the magnetic annealing apparatus of the third aspect, the workpieces are wafers, and the carrier is a FOUP, in which the FOUP is configured to accommodate 25 sheets of wafers, and the workpiece boat is configured to hold 100 sheets of wafers.

In the magnetic annealing apparatus of the third aspect, the workpiece boat is configured to hold the 100 sheets of wafers at predetermined intervals in an axial direction of the workpiece boat as a loading direction.

In the magnetic annealing apparatus of the third aspect, the workpiece boat is configured to hold two loading bodies in parallel to each other in an axial direction of the workpiece boat, each of the two loading bodies being loaded with 50 sheets of wafers at predetermined intervals in a direction perpendicular to the axial direction of the workpiece boat as the loading direction.

In the magnetic annealing apparatus of the third aspect, the clean gas introducing unit has a HEPA filter or an ULPA filter.

In the magnetic annealing apparatus of the third aspect, the exhaust unit has an exhaust hole formed in a ceiling of the magnetic annealing apparatus.

A fourth aspect of the present disclosure provides a magnetic annealing apparatus including: a carrier conveyance region where a carrier that accommodates one or more workpieces to be processed ("workpieces") is conveyed; a workpiece conveyance region where the workpieces are conveyed; and an opening/closing door interposed between the carrier conveyance region and the workpiece conveyance region. The carrier conveyance region includes: a first mounting table where a carrier carried into the magnetic annealing apparatus is placed; a plurality of second mounting tables where the carrier is mounted so as to convey the workpieces from the carrier conveyance region to the workpiece conveyance region through the opening/closing door in a hermetically sealed manner; a storage unit configured to store a plurality of carriers; and a carrier conveyance mechanism configured to perform carrying-out/carrying-in of the carriers among the first mounting table, the second mounting tables, and the storage unit. The workpiece conveyance region includes: an aligner device configured to align the workpieces; a workpiece boat configured to hold the workpieces; a workpiece conveyance mechanism configured to convey the workpieces among the carrier disposed on the second mounting tables, the aligner device, and the workpiece boat; a heating unit configured to heat the workpieces; a magnetic field generating unit including a horizontal superconducting magnet and configured to apply a magnetic field to the workpieces; a transfer mechanism configured to transfer the workpieces held by the workpiece boat into the magnetic field generating unit; a clean gas introducing unit configured to introduce a clean gas; and an exhaust unit configured to exhaust the clean gas, in which a flow direction of the clean gas formed by the clean gas introducing unit and the exhaust unit is parallel to main surfaces of the workpieces held in the workpiece boat.

The present disclosure may provide a magnetic annealing apparatus which is capable of performing both a perpendicular magnetization method for magnetic annealing and an in-plane magnetization method for magnetic annealing.

Hereinafter, exemplary embodiments of the present disclosure will be described with reference to drawings.

(Carrier)

FIG. 1 is a schematic perspective view illustrating an example of a wafer carrier C. In the present exemplary embodiment, descriptions will be made on a case in which a front opening unified pod (FOUP) is used as a carrier C configured to accommodate a plurality of wafers W. However, the present disclosure is not limited thereto.

One end of the carrier C of wafers W is formed as an opening and the other end is formed, for example, in a substantially semi-elliptical shape.

On an inner wall of the carrier C, a support portion is formed so that the wafers W may be disposed in multiple stages. When peripheral edges of, for example, 300 mm wafers W, are disposed in the support portion, the wafers W may be accommodated in multiple stages with approximately even pitches. In general, one carrier C may accommodate 25 sheets of wafers.

On a ceiling portion of the carrier C, a handle 10 is provided to be gripped when holding the carrier C.

As illustrated in FIG. 1, an opening/closing lid 12 corresponding to the opening is detachably attached to the opening of the carrier C, and the inside of the carrier C is substantially hermetically sealed by the opening/closing lid 12. In general, the atmosphere within the carrier C is clean air.

The opening/closing lid 12 is provided with, for example, two locking mechanisms 14 and when the locking mechanism 14 is locked or unlocked, the opening/closing lid 12 may be attached to or detached from the opening.

A plurality of positioning recesses (not illustrated) are formed on the lower surface of the bottom portion of the carrier C such that the positioning of the carrier C may be achieved when the carrier is placed on a mounting table to be described later. A lock member (not illustrated) is also provided at the bottom surface of the bottom portion of the carrier C such that the carrier C may be locked when placed on the mounting table.

(Magnetic Annealing Apparatus)

Figure 2:
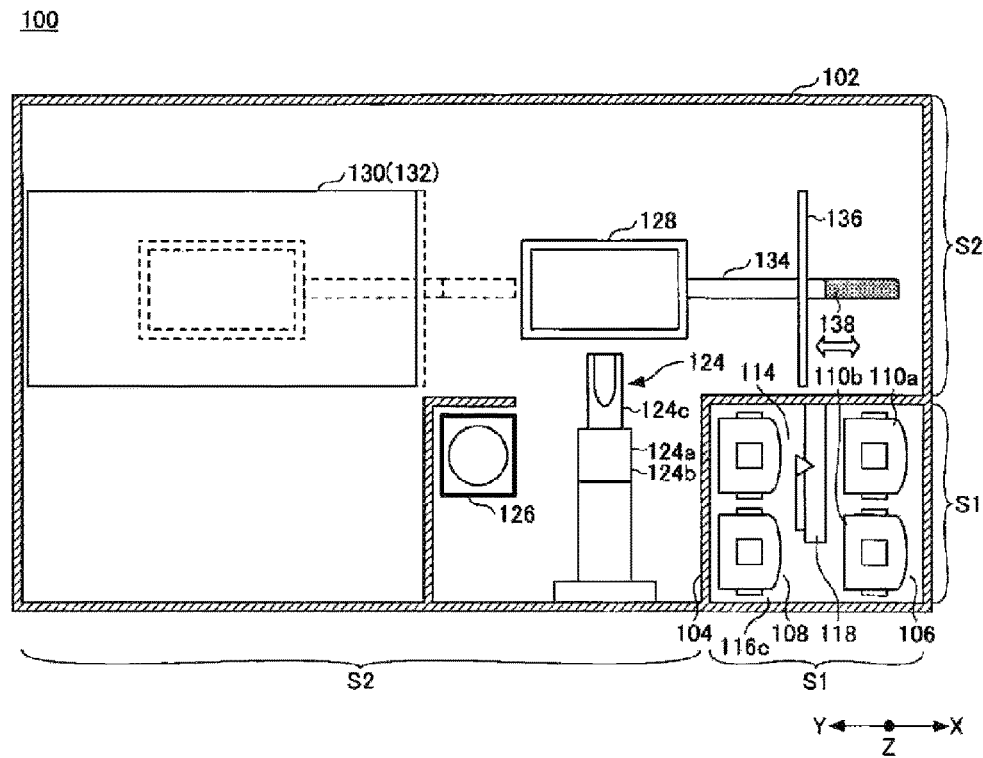
FIG. 2 is a schematic horizontal cross-sectional view illustrating an example of a magnetic annealing apparatus.

Next, descriptions will be made on an exemplary embodiment of the magnetic annealing apparatus. FIG. 2 is a schematic horizontal cross-sectional view illustrating an example of the magnetic annealing apparatus. Meanwhile, with respect to a wafer boat 128, a heat insulation portion 134, a cap 136, an angle adjusting mechanism 137, and a transfer mechanism 138 which will be described later, solid lines indicate a position at a time of conveying the wafers W to the wafer boat 128, and the dotted lines indicate a position at a time of performing the magnetic annealing processing on the wafers W.

As illustrated in FIG. 2, the magnetic annealing apparatus 100 is configured to be accommodated in a case 102. The case 102 forms the exterior body of the magnetic annealing apparatus and a carrier conveyance region S1 and a wafer conveyance region S2 are formed within the case 102.

The carrier conveyance region S1 is a region in which the carrier C, in which the wafers W are accommodated as the workpieces, is carried into or carried out of the magnetic annealing apparatus. In addition, the wafer conveyance region S2 is a transfer region in which the wafers W in the carrier C are conveyed and carried into a magnetic annealing furnace to be described later.

The carrier conveyance region S1 and the wafer conveyance region S2 are partitioned by a partition wall 104.

The carrier conveyance region S1 is placed under an air atmosphere and the wafers W accommodated in the carrier C are conveyed in the carrier conveyance region S1. A region between respective processing apparatuses corresponding to the carrier conveyance region S1 and, in the present exemplary embodiment, a space within a clean room outside of the magnetic annealing apparatus 100 corresponding to the carrier conveyance region S1.

Meanwhile, although not particularly limited, the atmosphere of the wafer conveyance region S2 may be an air atmosphere or an inert gas atmosphere such as, for example a nitrogen ($N_2$) atmosphere. When a processing is required to be performed under a lower oxygen atmosphere due to a configuration of a workpiece, for example, when it is desired to prevent formation of, for example, an oxide film, the inert gas atmosphere may be employed. In addition, the wafer conveyance region S2 is generally maintained a higher level of cleanness and a lower oxygen concentration as compared to the carrier conveyance region S1.

In the following description, the left-right direction of FIG. 2 is assumed to be a front-rear direction of the magnetic annealing apparatus 100. The carrier conveyance region S1 side is assumed to be the front side (the X direction in FIG. 2), and the wafer conveyance region S2 side is assumed to be rear side (the Y direction in FIG. 2). The Z-axis direction in FIG. 2 represents a vertical direction.

(Carrier Conveyance Region S1)

Figure 3:
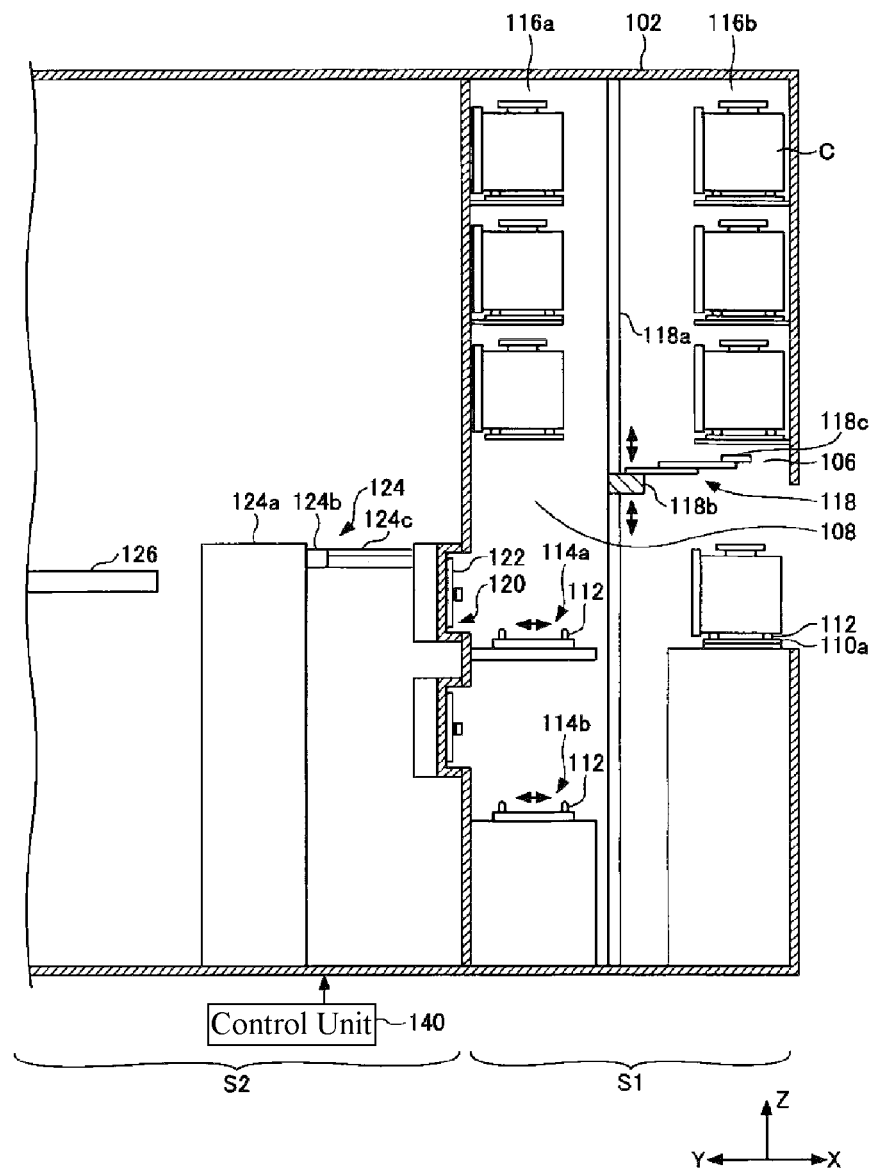
FIG. 3 is a schematic vertical cross-sectional view illustrating a vicinity of a carrier conveyance region of the magnetic annealing apparatus.

The carrier conveyance region S1 will be described in more detail. FIG. 3 illustrates a schematic vertical cross-sectional view of a vicinity of a carrier conveyance region of the magnetic annealing apparatus.

The carrier conveyance region S1 includes a first conveyance region 106 and a second conveyance region 108 positioned at the rear side of the first conveyance region 106.

As illustrated in FIG. 2, two first mounting tables 110a, 110b, on each of which a carrier C is placed, are provided in the left-right direction of the first conveyance region 106. On the mounting surface of each of the first mounting tables 110a, 110b, pins 112 configured to correspond to the positioning recesses of the carrier C and perform the positioning of the carrier C are provided at, for example, three locations, respectively.

In the second conveyance region 108, two second mounting tables 114a, 114b are provided in which the two second mounting tables 114a, 114b are arranged to be parallel to any one of the left and right first mounting tables (the mounting table 110a in the present exemplary embodiment) and disposed in series in the vertical direction of FIG. 3. Each of the second mounting tables 114a, 114b is configured to be movable in the front-rear direction.

On the mounting surface of the second mounting table 114a or 114b, a pin 112 configured to position the carrier C is provided at, for example, three positions in the same manner in each of the first mounting tables 110a, 110b. A hook (not illustrated) for fixing the carrier C is provided on the mounting surface.

As illustrated in FIG. 3, first carrier storage areas 116a, 116b configured to store carriers C are formed at the upper side of the second conveyance region 108 and/or the first conveyance region 106. Each of the carrier storage areas 116a, 116b is configured by, for example, two or more stages of shelves, and, for example, two carriers may be arranged on each shelf in the left-right direction.

As illustrated in FIG. 2, a second carrier storage unit 116c constituted by shelves in a plurality of stages is formed in the lateral direction of the second mounting tables 114a, 114b.

Since the first carrier storage units 116a and 116b, and the second carrier storage unit 116c are provided, a sufficient number of carriers C (i.e., a sufficient number of wafers W) may be kept within the carrier conveyance region S1.

The second conveyance region 108 is provided with a carrier conveyance mechanism 118 configured to convey the carriers C between the first and second mounting tables 110a, 110b; 114a, 114b and the first and second carrier storage units 116a; 116b, 116c. The carrier conveyance mechanism 118 includes a guide unit 118a configured to be movable up and down in the vertical direction, a moving unit 118b configured to move up and down while being guided by the guide unit 118a, and a conveyance arm 118c installed on the moving unit to support the bottom of the moving unit 118b and convey the moving unit 118b in the horizontal direction.

The partition wall 104 is formed with a conveyance port 120 of wafers W to allow the carrier conveyance region S1 and the wafer conveyance region S2 to communicate with each other. The conveyance port 120 is provided with an opening/closing door 122 which is configured to block the conveyance port 120 at the wafer conveyance region S2 side. A driving mechanism (not illustrated) is connected to the opening/closing door 122. By the driving mechanism, the opening/closing door 122 is configured to be movable forward, rearward, upward and downward so as to open/close the conveyance port 120.

<Conveyance of Wafers W in Carrier Conveyance Region S1>

Hereinafter, conveyance of wafers W from the carrier conveyance region S1 to the wafer conveyance region S2 will be described. In the carrier conveyance region S1, wafers W are conveyed in a state in which they are stored within a carrier C.

First, a carrier C is moved by the above-described conveyance 118c from first mounting table 110a or 110b, the first carrier storage unit 116a or 116b or the carrier storage unit 116c to the mounting table 114a or 110b. The carrier C is placed such that the positioning recesses thereof and the pins 112 are engaged with each other. When the carrier C is placed on the second mounting table 114, the second mounting table 114 is moved to the partition wall 104 side and the carrier C comes in contact with the partition wall 104. The contact state of the carrier C is maintained by a fixing mechanism (not illustrated).

Then, in a state where the opening/closing door 122 formed on the partition wall 104 and the opening/closing lid 12 of the carrier C are sealed, the opening/closing lid 12 is opened by an opening/closing mechanism (not illustrated). When the atmosphere of the wafer conveyance region S2 is formed as an inert gas atmosphere, first, inert gas replacement is performed by an inert gas replacement means (not illustrated) in the state where the opening/closing lid 12 of the carrier C is sealed and air is removed from the space between the opening/closing door 122 and the opening/closing lid 12 such that the space is filled with the inert gas. Subsequently, the inert gas replacement is performed inside the carrier C by the inert gas replacement means.

By opening the opening/closing door 122 formed in the partition wall 104 of the magnetic annealing apparatus 100, wafers W are carried into or out of the carrier C by a wafer conveyance mechanism 124 to be described later.

At the time of replacement of carriers C and carrying-out of wafers W, the reversed operation to the above described operation is performed.

(Wafer Conveyance Region S2)

Figure 4:
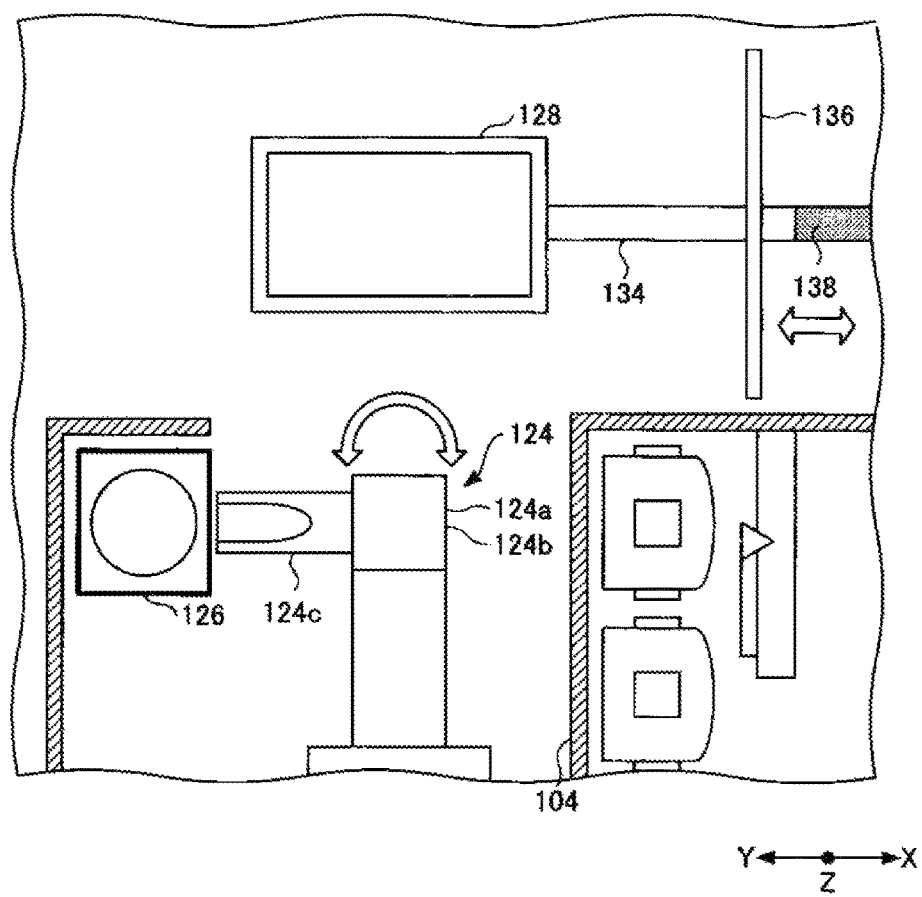
FIG. 4 is a schematic horizontal cross-sectional view illustrating a vicinity of a wafer conveyance region of the magnetic annealing apparatus.

FIG. 4 is a schematic horizontal cross-sectional view illustrating a vicinity of the wafer conveyance region S2 of the magnetic annealing apparatus 100. As illustrated in FIG. 4, in the wafer conveyance region S2, the wafer conveyance mechanism 124, an aligner device 126, the wafer boat 128, and a magnetic field generating unit 130 (see, e.g., FIG. 2) are mainly installed.

The wafer conveyance mechanism 124 serves to convey the wafers W in the wafer conveyance region S2 and is installed between the wafer boat 128 and the conveyance port 120 of the partition wall 104. The wafer conveyance mechanism 124 includes a moving body 124b that moves along a vertically extending guide mechanism 124a and rotates around the vertical axis, and, for example, five (5) reciprocating arm units 124c installed on a moving body 124b. The wafer conveyance mechanism 124 conveys wafers among the wafer boat 128, the carrier C on the second mounting table 114 or 114b, and the aligner device 126.

Further, the moving body 124b of the present exemplary embodiment is configured to be rotatable around the extension direction of the arms 124c as an axis. Accordingly, while the wafers W are conveyed by the arms 124c, the plane direction of main surfaces of the wafers W may be changed, for example, from a horizontal direction to a vertical direction, or from a vertical direction to a horizontal direction. That is, the wafer conveyance mechanism 124 of the present exemplary embodiment is capable of holding wafers W in a horizontal state or in a vertical state. The wafer conveyance mechanism 124 holds the wafers W generally by a chuck mechanism, and the holding method may be any of an electrostatic chuck method, a vacuum chuck method, and a mechanical chuck method.

As being configured as described above, the wafer conveyance mechanism 124 of the present exemplary embodiment is configured to be capable of moving in the front-rear direction (X-Y direction), the left-right direction, and the vertical Z direction as described above, and moving around the horizontal axis and the vertical axis such that the wafers W may be delivered among a carrier C, the aligner device 126, and the wafer boat 128.

The aligner device 126 is adapted to grip, for example, edges of wafers W to perform centering and angular alignment (positioning) of, for example, notches.

The wafer boat 128 is capable of holding a plurality of wafers W within a plurality of carriers C, for example, four (4) carriers C, and is placed at the rear side of the cap 136 with the insulating portion 134 being interposed between the wafer boat 128 and the cap 136. The cap 136 is supported at the rear side of the transfer mechanism 138. By the transfer mechanism 138, the wafer boat 128 is carried into or out of the magnetic field generating unit 130.

At the rear side of the wafer boat 128, the magnetic field generating unit 130 configured to perform a magnetic annealing processing on the wafers W is disposed. As for the magnetic field generating unit 130, a magnetic annealing furnace is used. The magnetic annealing furnace has a right end as a furnace port and is made of a horizontal solenoid type magnet (superconducting magnet). The solenoid type magnet is disposed such that its centerline axial direction is substantially horizontal, and is connected to a power supply device (not illustrated). The direction of the magnetic fields generated by the horizontal solenoid type magnet is the above described front-rear direction.

In addition, a heating unit 132 is disposed along the inner periphery of the magnetic field generating unit 130 to heat the wafers W to a predetermined temperature. That is, the wafers W are heated under uniform magnetic fields by the magnetic field generating unit 130.

When the same type magnetic annealing is performed on a plurality of wafers W, e.g., 100 sheets of wafers W, by using a solenoid type magnet, it is required to arrange the wafers W in a uniform magnetic field region so as to perform a uniform processing on all the wafers W. The uniform magnetic field region of the solenoid type magnet is about 20% of the axial length of the solenoid type magnet. For this reason, when, for example, 100 sheets of wafers W with a diameter of φ300 mm are processed by the magnetic annealing apparatus, the horizontal solenoid type magnet may be designed to have an inner diameter (bore diameter) of φ570 mm, an outer diameter of φ1900 mm, a length of 2500 mm (here, the length of a uniform magnetic field region is about 680 mm).

The weight of the horizontal solenoid type magnet as designed above is about 25 tons. For this reason, on the bottom of the solenoid type magnet, a holing base (not illustrated) and a holding plate (not illustrated) on the bottom of the holding base are provided so as to hold the solenoid type magnet.

As illustrated in FIG. 2, the magnetic annealing apparatus 100 is equipped with a control unit 140 which may be configured by, for example, a computer. The control unit 140 includes, for example, a program, a memory, and a data processing unit configured by a CPU. In the program, commands (respective steps) are incorporated so that control signals are sent from the control unit to the respective components of the magnetic annealing apparatus so as to progress respective processings. By the control signals, the conveyance of carriers C, the control of the inclined angle of the wafer boat 128 by the angle adjusting mechanism 137, the conveyance of wafers W, the opening/closing of the opening/closing door, the opening/closing of the lid, and the processings are performed. The program may be stored in a computer storage medium such as, for example, a flexible disc, a compact disc, a hard disc, a magneto optical (MO) disc, or a memory card, and installed in the control unit.

<Conveyance of Wafers W in Wafer Conveyance Region S2>

Descriptions will be made on a series of flows until the wafers W are conveyed from carriers C placed on the second mounting tables 114a and 114b to the magnetic field generating unit 130 via the wafer boat 128.

First, descriptions will be made with reference to FIGS. 5A to 5C on arrangement examples of wafers W within the wafer boat 128 when the wafers W are conveyed to the wafer boat 128 by the wafer conveyance mechanism 124.

Figure 5A:
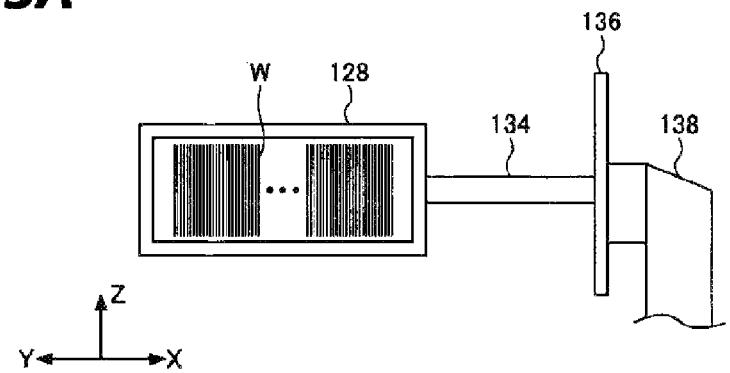
FIGS. 5A to 5C are schematic views for describing arrangement examples of wafers held within a wafer boat.
Figure 5B:
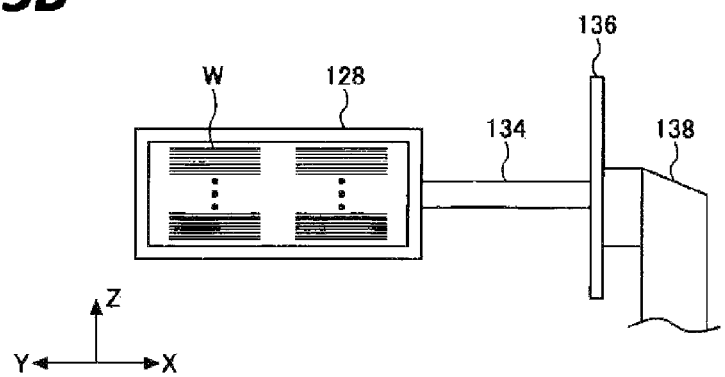
Figure 5C:
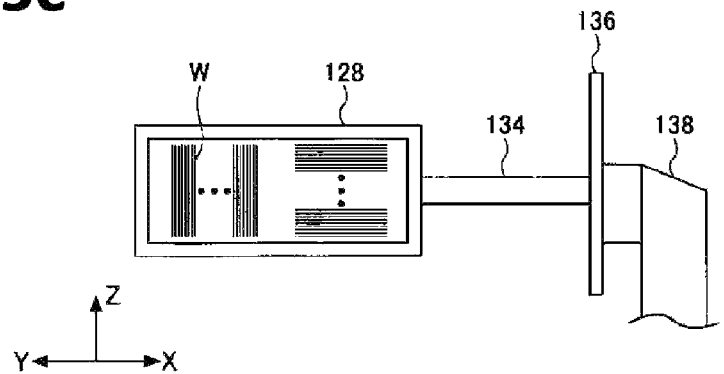

FIGS. 5A to 5C illustrate schematic views for describing arrangement examples of wafers W held within the wafer boat 128. More specifically, FIG. 5A is an arrangement example when main surfaces of the wafers W are arranged vertically, FIG. 5B is an arrangement example when main surfaces of the wafers W are arranged horizontally, and FIG. 5C is an arrangement example when main surfaces of the wafers W are arranged both vertically and horizontally. The X-Y axis direction and the Z axis direction in FIGS. 5A to 5C correspond to the X-Y axis direction and the Z axis direction in FIG. 2, respectively.

As the magnetic annealing processings of wafers W, there are known two magnetization methods, that is, a perpendicular magnetization method in which magnetic fields are applied in a direction perpendicular to the main surfaces of the wafers W, and an in-plane magnetization method in which the magnetic fields are applied in a direction parallel to the main surfaces of the wafers W. As in the present exemplary embodiment, when a horizontal superconducting magnet is employed as the magnetic field generating unit 130, the direction of the magnetic fields (magnetic force lines) within a magnet will be the X-Y axis direction. For this reason, when, for example, 100 sheets of wafers W are subjected to the magnetic annealing processing at once by the perpendicular magnetization method, as illustrated in FIG. 5A, one loading body is disposed within the wafer boat 128, the loading body being loaded with the wafers W at predetermined intervals in a shelf-like manner in the above described X-Y axis direction. Meanwhile, when, for example, 100 sheets of wafers W are subjected to the magnetic annealing processing at once by the in-plane magnetization method, as illustrated in FIG. 5B, two loading bodies, in each of which 50 sheets of wafers are loaded at predetermined intervals in a shelf-like manner in the above-mentioned Z axis direction as illustrated in FIG. 5B, are disposed to be aligned in parallel to each other in the X-Y axis direction within the wafer boat 128.

At present, the above described two magnetic annealing methods are carried out using separate devices, respectively. However, the magnetic annealing apparatus 100 of the present exemplary embodiment is configured such that the moving body 124b of the wafer conveyance mechanism 124 is rotatable around the extension direction of the arms 124c as an axis. Accordingly, the two magnetic annealing methods of the perpendicular magnetization method and the in-plane magnetization method may be carried out by the same device.

When the magnetic annealing apparatus 100 of the present exemplary embodiment is used, as illustrated in FIG. 5C, the wafers W may be loaded in such a manner that a loading direction of 50 sheets of wafers W becomes the X-Y axis direction, and a loading direction of the other 50 sheets of wafers W becomes the Z axis direction. Accordingly, the two magnetic annealing methods of the perpendicular magnetization method and the in-plane magnetization method may be carried out by a single magnetic annealing processing.

It is not clear which one of the above described two magnetic annealing methods will be put in the mainstream in the future. However, even when the magnetic annealing method is shifted to any one of the magnetic annealing methods, the magnetic annealing apparatus 100 of the present exemplary embodiment may perform both the magnetic annealing methods by replacing the wafer boat 128.

Hereinafter, the conveyance of wafers W within the wafer conveyance region S2 will be described in more detail with reference to FIGS. 6 and 7.

FIGS. 6A to 6I illustrate schematic views for describing an example of wafer conveyance by a wafer conveyance mechanism, and FIGS. 7A to 7H illustrate schematic views for describing another example of wafer conveyance by a wafer conveyance mechanism. More specifically, FIGS. 6A to 6I illustrate a conveyance example of wafers W in the case where the wafers W are processed by the perpendicular magnetization method, and FIGS. 7A to 7H illustrate a conveyance example of wafers W in the case where the wafers W are processed by the in-plane magnetization method.

First, descriptions will be made, with reference to FIGS. 6A to 6I, on the conveyance of wafers W when the wafers W are processed by the perpendicular magnetization method. In FIGS. 6A to 6I and FIGS. 7A to 7H, the partition wall 104 and the opening/closing door 122 are omitted for the sake of simplicity.

Figure 6A:
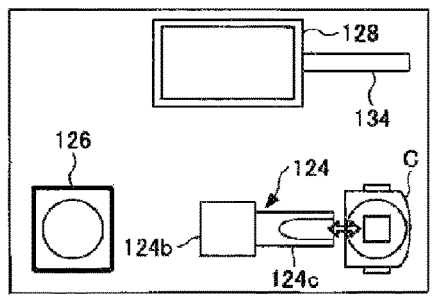
FIGS. 6A to 6I are schematic views for describing an example of wafer conveyance by a wafer conveyance mechanism.
Figure 6B:
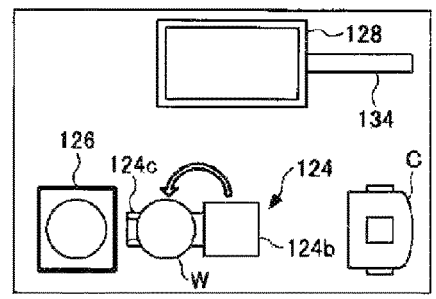
Figure 6C:
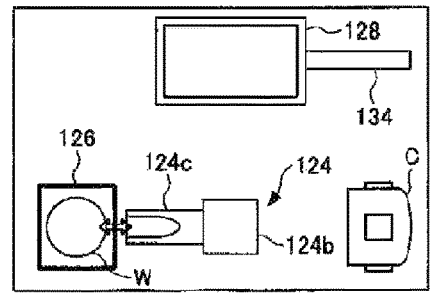
Figure 6D:
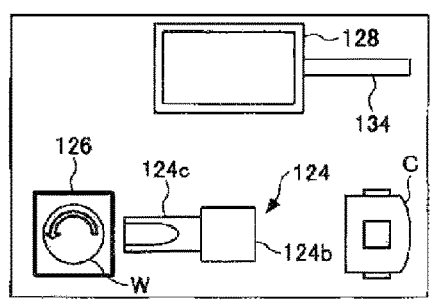
Figure 6E:
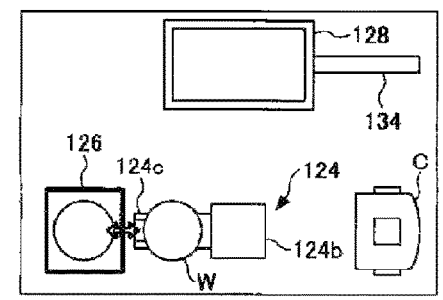
Figure 6F:
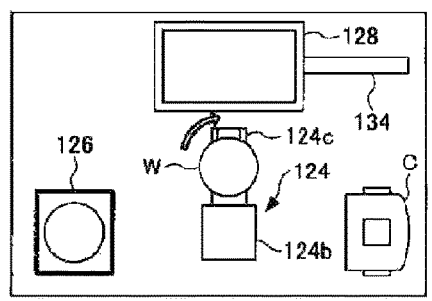
Figure 6G:
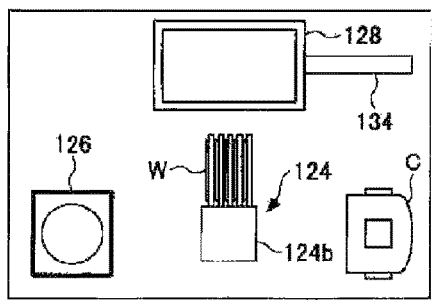
Figure 6H:
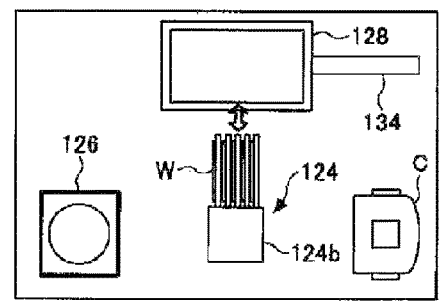
Figure 6I:
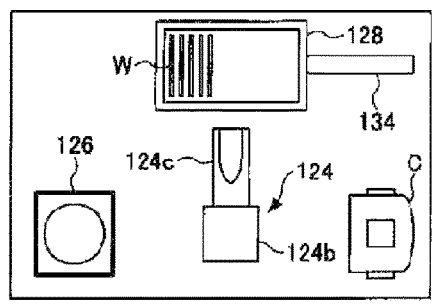

As illustrated in FIG. 6A, first, wafers W accommodated in a carrier C are delivered to the wafer conveyance mechanism 124. As described above, since the wafers W are generally accommodated horizontally in the carrier C, the wafer conveyance mechanism 124 conveys the wafers W while holding the wafers horizontally. Then, as illustrated in FIG. 6B, the moving body 124b rotates around the vertical axis so that the wafers W are transferred to the front side of the aligner device 126, and delivered to the aligner device 126 (FIG. 6C). As illustrated in FIG. 6D, in the aligner device 126, centering and angular alignment of, for example, notches are performed on the wafers W. Then, after the angular alignment has been terminated, the wafers W are delivered to the wafer conveyance mechanism 124 (FIG. 6E), and the moving body 124b rotates around the vertical axis to transfer the wafers W to the wafer boat 128 side (FIG. 6F). Then, the moving body 124b rotates 90° around the extension direction of the arms 124c as an axis. Accordingly, the wafers W are held vertically by the arms 124c. The vertically held wafers W are delivered to the wafer boat 128 as illustrated in FIG. 6H, and the conveyance of the wafers W is completed (FIG. 6I). After the transfer of the wafers W into the wafer boat 128 is completed, the wafer conveyance mechanism 124 returns to the carrier C, and the next wafers W are transferred in the same method as described above.

The number of wafers W held within one carrier C is generally 25 sheets, and the number of wafers W conveyed by the wafer conveyance mechanism 124 is generally 5 sheets. Accordingly, for one carrier C, the transfer of wafers W from the carrier C to the wafer boat 128 via the aligner device 126 is performed five times. After the transfer of wafers W from a carrier C placed on one side second mounting table (e.g., the second mounting table 114a) is completed, the transfer of wafers W from the carrier C placed on the other side second mounting table (e.g., the second mounting table 114b) is performed by the wafer conveyance mechanism 124. Here, the empty carrier C placed on the second mounting table 114a is replaced with another carrier C stored in the carrier storage unit 116a, 116b, or 116c while the transfer of the wafers W from the carrier C placed on the second mounting table 114b at the other side is performed.

Meanwhile, descriptions will be made, with reference to FIGS. 7A to 7H, on the conveyance of wafers W when the wafers W are processed by the in-plane magnetization method.

Figure 7A:
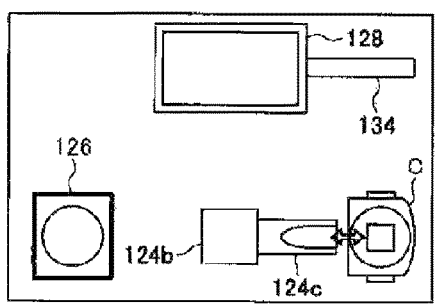
FIGS. 7A to 7H are schematic views for describing another example of wafer conveyance by a wafer conveyance mechanism.
Figure 7B:
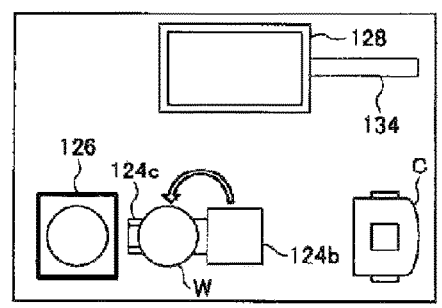
Figure 7C:
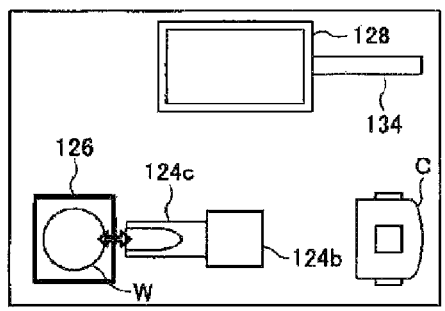
Figure 7D:
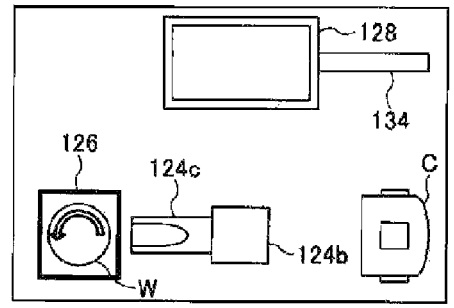
Figure 7E:
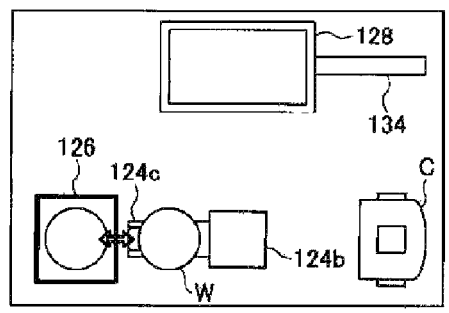
Figure 7F:
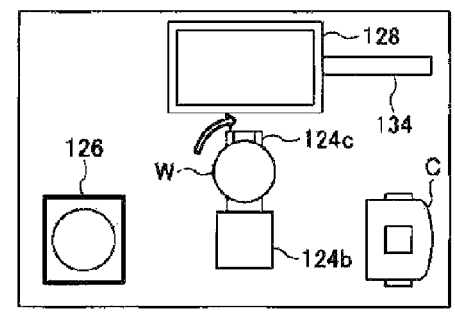
Figure 7G:
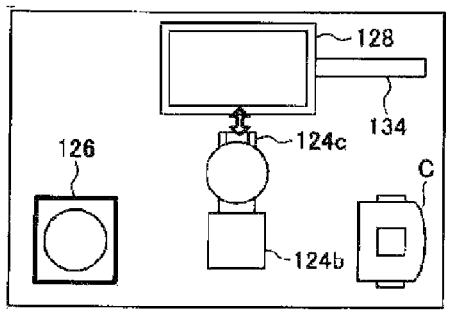
Figure 7H:
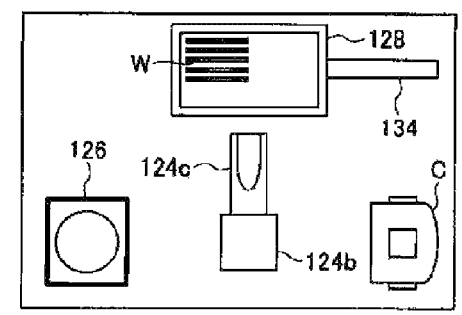

When the wafers W are processed by the in-plane magnetization method, the wafers W are conveyed in the same manner as described above until the moving body 124b rotates around the vertical axis as illustrated in FIG. 6F so as to transfer the wafers W to the wafer boat 128 side (FIGS. 7A to 7F). Then, in the in-plane magnetization method, the moving body 124b does not rotate to deliver the horizontally held wafers W to the wafer boat 128 as they are (FIG. 7G), and the conveyance of the wafers W is completed (FIG. 7H).

In the magnetic annealing apparatus 100 of the present exemplary embodiment, the wafers W may be arranged in such a manner that 50 sheets of wafers W are loaded such that the loading direction thereof becomes the X-Y axis direction, and the other 50 sheets of wafers W are loaded such that the loading direction thereof becomes the Z axis direction. When the 100 sheets of wafers W are arranged in the above described arrangement, first, 50 sheets of wafers W are conveyed by the method as illustrated in FIGS. 6A to 6I, and then other 50 sheets of wafers W are conveyed by the method as illustrated in FIGS. 7A to 7H. Otherwise, first, 50 sheets of wafers W may be conveyed by the method as illustrated in FIGS. 7A to 7H, and then the other 50 sheets of wafers W may be conveyed by the method as illustrated in FIGS. 6A to 6I.

After a predetermined number of wafers W, for example, 100 sheets of wafers W, are conveyed to the wafer boat 128, the wafer boat 128 is loaded in the magnetic field generating unit 130 by the transfer mechanism 138. The position of the wafer boat 128 indicated by the dashed line of FIG. 2 is a position after loading. Then, the wafers W are subjected to a predetermined magnetic annealing processing. After the process is completed, the carrying-out of the wafers W is performed by, first, unloading the wafer boat 128 from the magnetic field generating unit 130, and then transferring the wafers W from an opening/closing door positioned at the second mounting table 114a or 114b to the carrier C by the wafer conveyance mechanism 124 in the reversed sequence to that of the above described carrying-in. After the wafers W are conveyed to the carrier C by the wafer conveyance mechanism 124, the opening/closing lid 12 is attached to the carrier C by an opening/shutting mechanism (not illustrated), and the carrier C is carried out by the carrier conveyance mechanism 118 to proceed to the following process.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A magnetic annealing apparatus comprising:
   a magnetic field generating unit comprising a horizontal superconducting magnet to generate a magnetic field inside the magnetic field generating unit, the magnetic field generating unit being configured to conduct a magnetic annealing processing on one or more workpieces to be processed held in a workpiece boat by the magnetic field;
   a carrier configured to accommodate the one or more workpieces before the magnetic annealing processing; and
   an arm configured to convey the one or more workpieces held in the carrier to the workpiece boat,
   wherein the arm is configured to rotate the one or more workpieces based on a magnetization method to change a direction in which a surface of the one or more workpieces is oriented with respect to the magnetic field generated inside the magnetic field generating unit, wherein the magnetization method in a first mode applies the magnetic field in a direction perpendicular to the surface of the one or more workpieces and in a second mode applies the magnetic field in a direction parallel to the surface of the one or more workpieces.

2. The magnetic annealing apparatus of claim 1, wherein the arm holds the one or more workpieces and horizontally extends, and the arm is rotatable around an extension direction of the arm as an axis.

3. The magnetic annealing apparatus of claim 1, wherein the arm holds the one or more workpieces.

4. The magnetic annealing apparatus of claim 1, wherein the one or more workpieces are wafers and the carrier is a front opening unified pod (FOUP), and wherein the FOUP is configured to accommodate 25 sheets of wafers and the workpiece boat is configured to hold 100 sheets of wafers.

5. The magnetic annealing apparatus of claim 4, wherein the workpiece boat is configured to accommodate the 100 sheets of wafers in a state where main surfaces of the wafers are vertical.

6. The magnetic annealing apparatus of claim 4, wherein the workpiece boat is configured to hold two wafer containers, each of the two wafer containers being loaded with 50 sheets of wafers in a state where main surfaces of the wafers are horizontal.

7. The magnetic annealing apparatus of claim 4, wherein the workpiece boat is configured to hold a first wafer container in which 50 sheets of wafers are loaded in a state where main surfaces of the wafers are horizontal, and a second wafer container in which 50 sheets of wafers are loaded in a state where main surfaces of the wafers are vertical.

8. A magnetic annealing apparatus comprising:
a carrier conveyance region where a carrier that accommodates one or more workpieces to be processed is conveyed;
a workpiece conveyance region where the one or more workpieces are conveyed; and
an opening/closing door interposed between the carrier conveyance region and the workpiece conveyance region,
wherein the carrier conveyance region includes:
a first mounting table where a carrier carried into the magnetic annealing apparatus is placed;
a plurality of second mounting tables where the carrier is mounted so as to convey the one or more workpieces from the carrier conveyance region to the workpiece conveyance region through the opening/closing door in a hermetically sealed manner;
a storage unit configured to store a plurality of carriers; and
a carrier conveyance mechanism configured to perform carrying-out/carrying-in of the carriers among the first mounting table, the second mounting tables, and the storage unit,
wherein the workpiece conveyance region includes:
an aligner device configured to align the one or more workpieces;
a workpiece boat configured to hold the one or more workpieces;
an arm configured to convey the one or more workpieces among the carrier disposed on the second mounting tables, the aligner device, and the workpiece boat;
a heating unit configured to heat the one or more workpieces;
a magnetic field generating unit including a horizontal superconducting magnet and configured to apply a magnetic field to the one or more workpieces held in the workpiece boat; and
a transfer mechanism configured to transfer the one or more workpieces held by the workpiece boat into the magnetic field generating unit, and
wherein the arm is configured to rotate the one or more workpieces based on a magnetization method to change a direction in which a surface of the one or more workpieces is oriented with respect to the magnetic field generated inside the magnetic field generating unit, wherein the magnetization method in a first mode applies the magnetic field in a direction perpendicular to the surface of the one or more workpieces and in a second mode applies the magnetic field in a direction parallel to the surface of the one or more workpieces.

9. A magnetic annealing apparatus comprising:
a horizontal superconducting magnet that constitutes a magnetic field generating unit configured to generate a magnetic field so as to conduct a magnetic annealing processing on one or more workpieces to be processed;
a workpiece boat configured to hold the one or more workpieces;
an arm configured to convey the one or more workpieces between a carrier that accommodates the one or more workpieces and the workpiece boat, wherein the arm is configured to rotate the one or more workpieces based on a magnetization method to change a direction in which a surface of the one or more workpieces is oriented with respect to the magnetic field, wherein the magnetization method in a first mode applies the magnetic field in a direction perpendicular to the surface of the one or more workpieces and in a second mode applies the magnetic field in a direction parallel to the surface of the one or more workpieces;
a transfer mechanism configured to transfer the one or more workpieces held by the workpiece boat into the magnetic field generating unit;
a clean gas introducing unit configured to introduce a clean gas; and
an exhaust unit configured to exhaust the clean gas,
wherein a flow direction of the clean gas formed by the clean gas introducing unit and the exhaust unit is parallel to main surfaces of the one or more workpieces held in the workpiece boat.

10. The magnetic annealing apparatus of claim 9, wherein the clean gas introducing unit is disposed at a downstream side with respect to the workpiece boat in a conveyance direction where the workpiece conveyance mechanism conveys the one or more workpieces to the workpiece boat, and
the exhaust unit is disposed at an upstream side with respect to the workpiece conveyance mechanism in the conveyance direction where the workpiece conveyance mechanism conveys the one or more workpieces to the workpiece boat.

11. The magnetic annealing apparatus of claim 9, wherein the workpiece boat is configured to hold the main surfaces of the one or more workpieces either horizontally or vertically, and
the flow of the clean gas is a side flow.

12. The magnetic annealing apparatus of claim 9, wherein the one or more workpieces are wafers, and the carrier is a FOUP,
wherein the FOUP is configured to accommodate 25 sheets of wafers, and the workpiece boat is configured to hold 100 sheets of wafers.

13. The magnetic annealing apparatus of claim 12, wherein the workpiece boat is configured to hold the 100 sheets of wafers at predetermined intervals in an axial direction of the workpiece boat as a loading direction.

14. The magnetic annealing apparatus of claim 12, wherein the workpiece boat is configured to hold two loading bodies in parallel to each other in an axial direction of the workpiece boat, each of the two loading bodies being loaded with 50 sheets of wafers at predetermined intervals in a direction perpendicular to the axial direction of the workpiece boat as the loading direction.

15. The magnetic annealing apparatus of claim 9, wherein the clean gas introducing unit has a HEPA filter or an ULPA filter.

16. The magnetic annealing apparatus of claim 9, wherein the exhaust unit has an exhaust hole formed in a ceiling of the magnetic annealing apparatus.

17. A magnetic annealing apparatus comprising:
a carrier conveyance region where a carrier that accommodates one or more workpieces to be processed is conveyed;
a workpiece conveyance region where the one or more workpieces are conveyed; and
an opening/closing door interposed between the carrier conveyance region and the workpiece conveyance region,
wherein the carrier conveyance region includes:
a first mounting table where a carrier carried into the magnetic annealing apparatus is placed;
a plurality of second mounting tables where the carrier is mounted so as to convey the one or more workpieces from the carrier conveyance region to the workpiece conveyance region through the opening/closing door in a hermetically sealed manner;
a storage unit configured to store a plurality of carriers; and
a carrier conveyance mechanism configured to perform carrying-out/carrying-in of the carriers among the first mounting table, the second mounting tables, and the storage unit,
wherein the workpiece conveyance region includes:
an aligner device configured to align the one or more workpieces;
a workpiece boat configured to hold the one or more workpieces;
an arm configured to convey the one or more workpieces among the carrier disposed on the second mounting tables, the aligner device, and the workpiece boat;
a heating unit configured to heat the one or more workpieces;
a magnetic field generating unit including a horizontal superconducting magnet and configured to apply a magnetic field to the one or more workpieces;
a transfer mechanism configured to transfer the one or more workpieces held by the workpiece boat into the magnetic field generating unit;
a clean gas introducing unit configured to introduce a clean gas;
an exhaust unit configured to exhaust the clean gas,
wherein a flow direction of the clean gas formed by the clean gas introducing unit and the exhaust unit is parallel to main surfaces of the one or more workpieces held in the workpiece boat,
and wherein the arm is configured to rotate the one or more workpieces based on a magnetization method to change a direction in which a surface of the one or more workpieces is oriented with respect to the magnetic field, wherein the magnetization method in a first mode applies the magnetic field in a direction perpendicular to the surface of the one or more workpieces and in a second mode applies the magnetic field in a direction parallel to the surface of the one or more workpieces.

* * * * *